United States Patent
Tsai

(10) Patent No.: US 9,632,486 B2
(45) Date of Patent: Apr. 25, 2017

(54) MASKING CIRCUIT AND TIME-TO-DIGITAL CONVERTER COMPRISING THE SAME

(71) Applicant: TAIWAN SEMICONDUCTOR MANUFACTURING COMPANY LTD., Hsinchu (TW)

(72) Inventor: Tsung-Hsien Tsai, Taoyuan County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 15/014,905

(22) Filed: Feb. 3, 2016

(65) Prior Publication Data

US 2016/0156363 A1    Jun. 2, 2016

Related U.S. Application Data

(62) Division of application No. 14/149,149, filed on Jan. 7, 2014, now Pat. No. 9,270,290.

(51) Int. Cl.
*G04F 10/00* (2006.01)
*H03L 7/085* (2006.01)

(52) U.S. Cl.
CPC ............ *G04F 10/005* (2013.01); *H03L 7/085* (2013.01); *H03L 2207/18* (2013.01); *H03L 2207/50* (2013.01)

(58) Field of Classification Search
CPC ............... G04F 10/005; H03L 2207/18; H03L 2207/50; H03L 7/085; H03L 7/193
USPC ....... 327/2, 3, 141, 142, 159, 161, 162, 163; 375/373, 375, 376
See application file for complete search history.

(56) References Cited

U.S. PATENT DOCUMENTS

| 5,298,867 A * | 3/1994 | Mestha ...................... H03L 7/00 315/500 |
| 8,884,804 B1 * | 11/2014 | Majumdar ............ G04F 10/005 341/120 |
| 8,976,053 B1 * | 3/2015 | Zhang ................... G04F 10/005 341/155 |

* cited by examiner

*Primary Examiner* — William Hernandez
(74) *Attorney, Agent, or Firm* — WPAT, P.C., Intellectual Property Attorneys; Anthony King

(57) ABSTRACT

A circuit includes a reset circuit, a counter and a comparator. The reset circuit generates a reset signal based on a reference signal and a controlled signal. The reference signal and the controlled signal are to be sent to the TDC for detection of phase difference. The counter counts to a predetermined value associated with the reference signal and the controlled signal, and is reset to an initial value in response to the reset signal. The comparator compares a count from the counter and the predetermined value, and generates a mask signal when a count from the counter equals the predetermined value. The mask signal masks a portion of pulses of the controlled signal from entering the TDC.

20 Claims, 9 Drawing Sheets

MASKING CIRCUIT AND TIME-TO-DIGITAL CONVERTER COMPRISING THE SAME

CROSS-REFERENCE TO RELATED APPLICATIONS

This application is a divisional of U.S. application Ser. No. 14/149,149, filed Jan. 7, 2014.

BACKGROUND

Phase locked loop (PLL) is an important component in communication. Nowadays, all-digital PLL (ADPLL) has been researched and developed to replace analog PLL because ADPLL is free from large analog loop filters and passive elements. Time-to-digital converter (TDC) in ADPLL replaces phase detector and charge pump, and functions to detect phase difference between a control signal of ADPLL and a reference clock signal. TDC is often used in high-speed communication systems and affects the resolution of APDLL and noise performance.

BRIEF DESCRIPTION OF THE DRAWINGS

The details of one or more embodiments of the disclosure are set forth in the accompanying drawings and the description below. Other features and advantages of the disclosure will be apparent from the description, drawings and claims.

Like reference symbols in the various drawings indicate like elements.

DETAILED DESCRIPTION

Figure 1A:
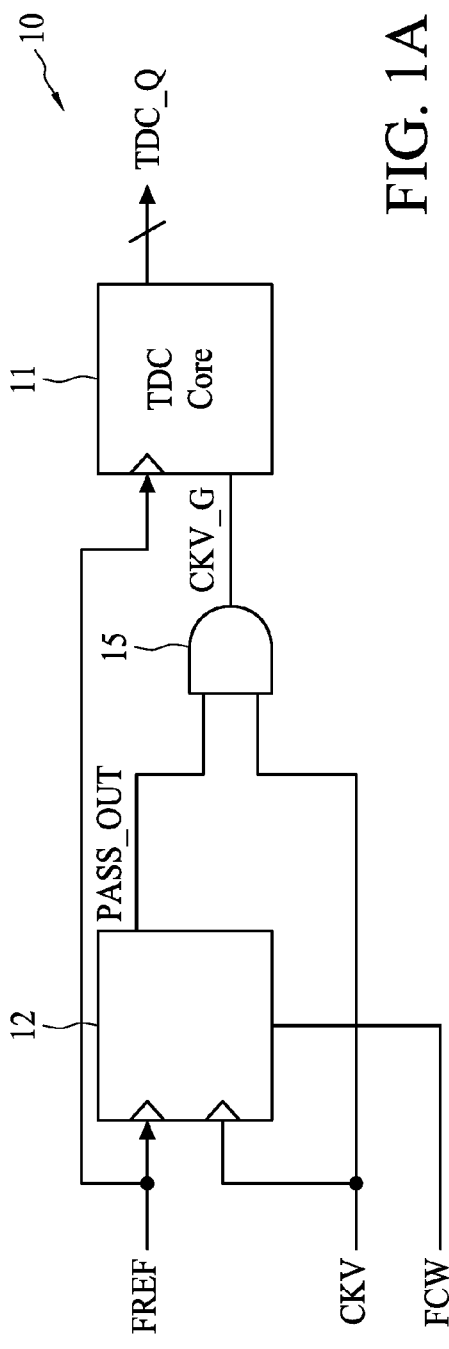
FIG. 1A is a schematic diagram of a time-to-digital converter (TDC) including a masking circuit, in accordance with some embodiments.

Embodiments, or examples, of the disclosure illustrated in the drawings are now described using specific language. It will nevertheless be understood that no limitation of the scope of the disclosure is thereby intended. Any alterations and modifications in the described embodiments, and any further applications of principles described in this document are contemplated as would normally occur to one of ordinary skill in the art to which the disclosure relates. Reference numerals may be repeated throughout the embodiments, but this does not necessarily require that feature(s) of one embodiment apply to another embodiment, even if they share the same reference numeral. It will be understood that when an element is referred to as being "connected to" or "coupled with" another element, it may be directly connected to or coupled to the other element, or intervening elements may be present.

In the below description, a signal is asserted with a high logical value to activate a corresponding device when the device is active high. In contrast, the signal is deasserted with a low logical value to deactivate the corresponding device. When the device is active low, however, the signal is asserted with a low logical value to activate the device, and is deasserted with a high logical value to deactivate the device.

FIG. 1A is a schematic diagram of a time-to-digital converter (TDC) 10 including a masking circuit 12, in accordance with some embodiments. Referring to FIG. 1A, TDC 10 includes a TDC core 11 and a decision circuit 15 in addition to masking circuit 12. TDC core 11 serves as a phase detector in an all digital phase locked loop (ADPLL) that can account for variations in process, voltage and temperature (PVT) conditions. TDC core 11 includes delay elements that provide a delay line, and flip flops at taps of the delay line. The delay elements may be configured into an inverter chain composed of hundreds of inverters. TDC core 10 functions to determine a phase difference between a reference signal FREF and a digitally controlled oscillator (DCO) signal (hereinafter a controlled signal) CKV, and translate the phase difference into a digital code. Based on the digital code, the ADPLL generates a TDC tuning word that adjusts a delay introduced by one or more of the delay elements to account for the variations in PVT conditions. In some embodiments, TDC core 11 includes but is not limited to a buffer delay line TDC, an inverter delay line TDC, a Vernier TD or a gated ring oscillator (GRO) TDC.

Masking circuit 12 generates a mask signal PASS_OUT in response to reference signal FREF, controlled signal CKV and a command signal FCW. FCW refers to a frequency command word, which is obtained by dividing the frequency of controlled signal CKV by the frequency of reference signal FREF, as expressed in an equation below.

$$FCW = \frac{CKV(\text{frequency})}{FREF(\text{frequency})}$$

Effectively, the desired frequency of controlled signal CKV is an FCW multiple of the frequency of reference signal FREF. In some embodiments, in case the frequency of controlled signal CKV is not divisible by the frequency of reference signal FREF and thus FCW has a decimal, FCW is rounded off to an integer or rounded up to a nearest integer. Masking circuit 12 will be further discussed later with reference to FIGS. 2 and 3.

Decision circuit 15 generates a gate signal CKV_G as an output in response to mask signal PASS_OUT and controlled signal CKV. In some embodiments, decision circuit 15 includes a logical AND gate. Gate signal CKV_G is a portion, but not all, of controlled signal CKV in one period of reference signal FREF. Gate signal CKV_G is composed of an amount of CKV pulses sufficient for detection of phase difference in TDC core 11. In some embodiments, gate signal CKV_G is composed of one or two CKV pulses in one FREF period. Gate signal CKV_G will be further discussed later with reference to FIG. 4.

TDC core 11 receives reference signal FREF as it is applied to masking circuit 12, and receives gate signal CKV_G from decision circuit 15. TDC core 11 determines a phase difference between the received reference signal FREF and gate signal CKV_G, and generates an output TDC_Q. As viewed from TDC core 11, only a small portion of controlled signal CKV in one FREF period passes through decision circuit 15 and reaches TDC core 10, while a large, remaining portion of controlled signal CKV in the FREF period is gated by decision circuit 15 and thus is not received at TDC core 11. As compared to some existing TDC circuits where all or a relatively large portion of CKV pulses enter TDC core, TDC 11 according to the present disclosure achieves more economic and efficient power management.

Figure 1B:
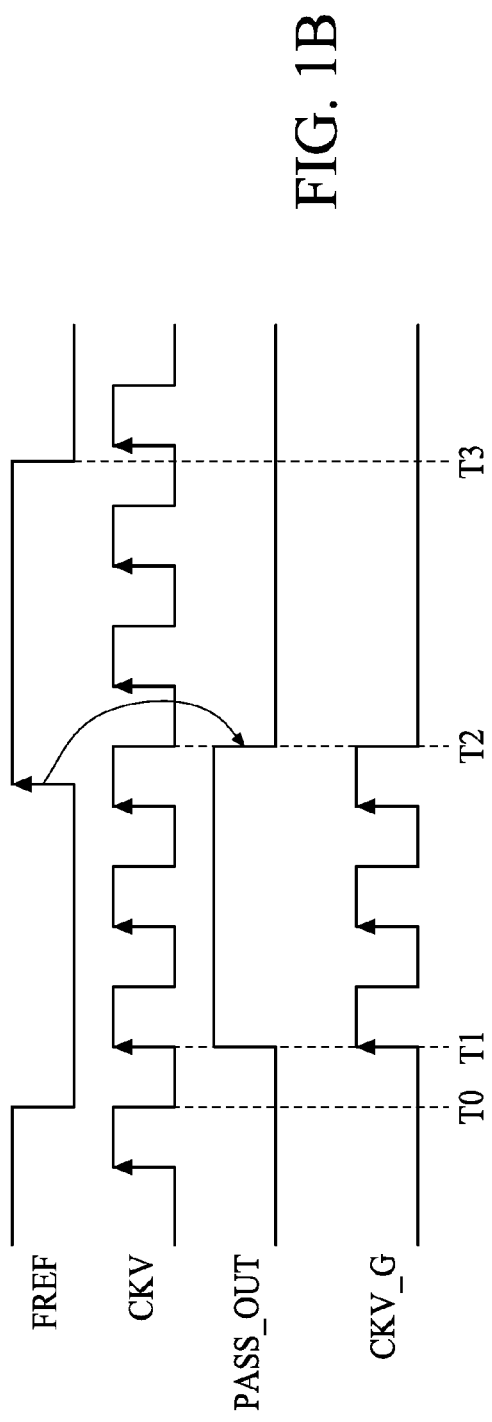
FIG. 1B is a timing diagram of illustrative signals corresponding to the TDC in FIG. 1A, in accordance with some embodiments.

FIG. 1B is a timing diagram of illustrative signals corresponding to TDC 11 in FIG. 1A, in accordance with some embodiments. Referring to FIG. 1B, mask signal PASS_OUT is logically ANDed with controlled signal CKV, resulting in gate signal CKV_G. Gate signal CKV_G in the present embodiment is composed of CKV pulses in a time period between time T1 and time T2 during an FREF period between time T0 and time T3. The falling edge of mask signal PASS_OUT at time T2 is determined by a rising edge of reference signal FREF in the period between time T1 and time T2. The rising edge of mask signal PASS_OUT at time T1 is determined by FCW minus N (FCW−N), where N is an integer that satisfies a formula below.

$$PCKV \times N > DTDC$$

where PCKV represents the period of controlled signal CKV, and DTDC represents the delay to be introduced by the delay elements in TDC core 11 if controlled signal CKV enters TDC core 11 without masking. In physical sense, N represents the number of CKV pulses that is allowed to send to TDC core 11.

For example, PCKV is 50 picosecond (ps) and DTDC is 100 ps. Then N is determined to be 3, according to the formula. Moreover, FCW in the illustrative embodiment of FIG. 1B can be determined to be 5. As a result, the value of (FCW−N) is 2. In some embodiments, controlled signal CKV may run at 3 gigahertz (GHz) and thus the period of controlled signal CKV is approximately 333 ps. Further, reference signal FREF may run at 200 megahertz (MHz). As a result, FCW is 15 (=3 GHz/200 MHz). Moreover, TDC core 10 may include 223 inverters, which totally introduce a delay of approximately 2 nanosecond (ns). According to the formula, N is determined to be 6 (2 ns/333 ps). As a result, the value of (FCW−N) is 9 (=15−6). The above-mentioned parameters are exemplary only and may change as design or application changes. Accordingly, other parameters associated with controlled signal CKV, reference signal FREF and delay elements of TDC core 10 also fall within the contemplated scope of the present disclosure. The rising edge and falling edge of mask signal PASS_OUT will be further discussed in detail with reference to FIG. 4.

Figure 2:
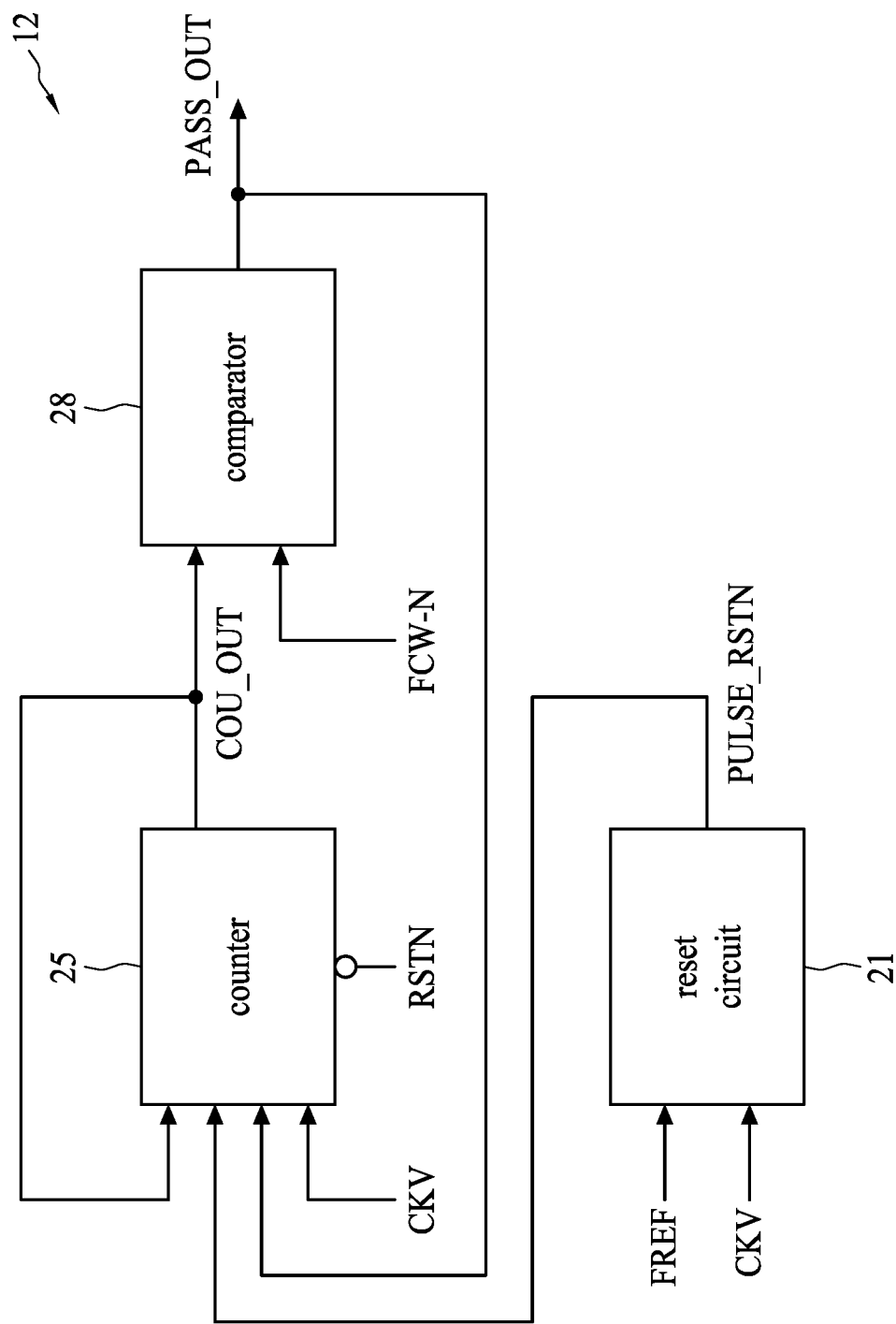
FIG. 2 is a block diagram of the masking circuit in FIG. 1A, in accordance with some embodiments.

FIG. 2 is a block diagram of masking circuit 12 in FIG. 1A, in accordance with some embodiments. Referring to FIG. 2, masking circuit 12 includes a reset circuit 21, a counter 25 and a comparator 28. As previously discussed, masking circuit 12 is configured to generate mask signal PASS_OUT in response to reference signal FREF, controlled signal CKV and a command signal (FCW−N). Moreover, based on mask signal PASS_OUT, the number of CKV pulses in gate signal CKV-G to send to TDC core 10 for phase difference detection is determined.

Reset circuit 21 is configured to generate a reset signal PULSE_RSTN in response to reference signal FREF and controlled signal CKV. Reset signal PULSE_RSTN is used to reset counter 25.

Counter 25 receives reset signal PULSE_RSTN and is configured to count to a predetermined value, (FCW−N), until reset signal PULSE_RSTN is asserted. Counter 25 provides a count cou_out to comparator 28. Count cou_out is fed back to counter 25 to serve as a basis for calculating a new count.

Comparator 28 receives count cou_out from counter 25 and is configured to generate mask signal PASS_OUT by comparing count cou_out and the value (FCW−N). In some embodiments, if count cou_out equals the value (FCW−N), mask signal PASS_OUT is asserted. Mask signal PASS_OUT is fed back to counter 25 for calculating a new count.

Figure 3:
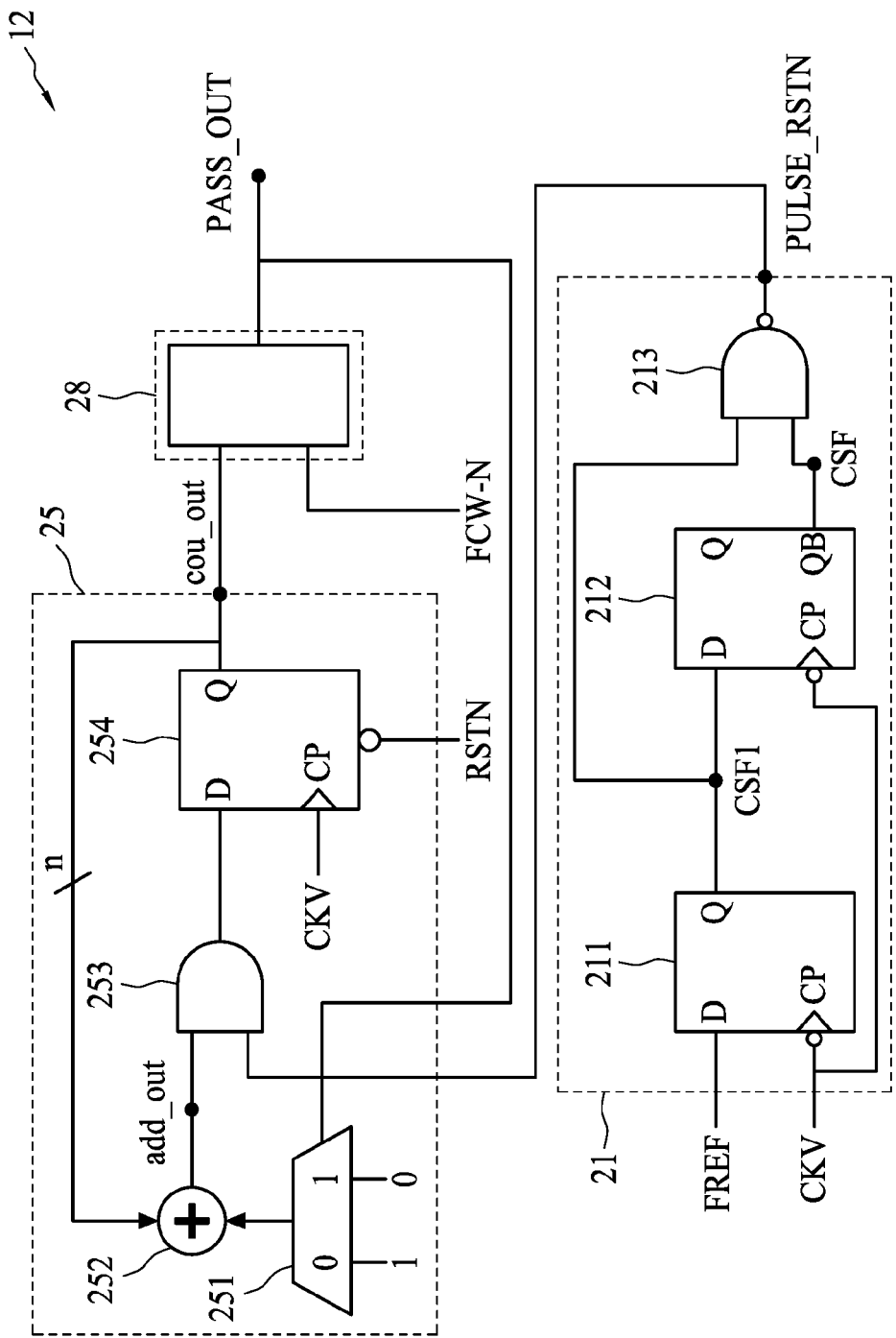
FIG. 3 is an exemplary circuit diagram of the masking circuit in FIG. 1A, in accordance with some embodiments.

FIG. 3 is an exemplary circuit diagram of masking circuit 12 in FIG. 1A, in accordance with some embodiments. Referring to FIG. 3, reset circuit 21 includes a first D-type flip flop (hereinafter DFF) 211, a second DFF 212 and a NAND gate 213. Counter 25 includes a selecting device such as a multiplexer 251, a summing device such as an adder 252, an AND gate assembly 253 and a DFF 254.

In reset circuit 21, a data input (labeled "D") of first DFF 211 receives reference signal FREF. A clock input (labeled "CP") of first DFF 211 receives an inverted controlled signal CKV. A data output (labeled "Q") of first DFF 211 outputs signal CSF1.

Further, a data input (labeled "D") of second DFF 212 receives signal CSF1 from first DFF 211. A clock input (labeled "CP") of second DFF 212 receives inverted controlled signal CKV. A complementary data output (labeled "QB") of second DFF 212 outputs signal CSF.

Moreover, an input of NAND gate 213 receives signal CSF1. Another input of NAND gate 213 receives signal CSF. An output of NAND gate 213 outputs reset signal PULSE_RSTN.

In counter 25, an input of multiplexer 251 is coupled to a high logical value, while another input of multiplexer 251 is coupled to a low logical value. Mask signal PASS_OUT fed to multiplexer 251 serves as a control signal for multiplexer 251. If mask signal PASS_OUT is asserted with a high logical value, multiplexer 251 outputs a low logical value. In contrast, if mask signal PASS_OUT is deasserted with a low logical value, multiplexer 251 outputs a high logical value.

Adder 252 sums up an output from multiplexer 251 and count cou_out from DFF 254. Count cou_out is an n-bit binary that represents the decimal value of (FCW−N). Adder 252 then outputs a signal add_out, which is also an n-bit binary.

AND gate assembly 253 receives signal add_out from adder 252 and reset signal PULSE_RSTN from reset circuit 21. AND gate assembly 253 includes "n" AND gates. For illustration, only one AND gate is shown. Each of the "n" AND gates includes an input for receiving one bit of the n-bit signal add_out, and another input for receiving reset signal PULSE_RSTN. As a result, AND gate assembly 253 outputs the content of signal add_out when reset signal PULSE_RSTN is logically high, which means reset signal PULSE_RSTN is not asserted. AND gate assembly 253 outputs an all-0 n-bit binary when reset signal PULSE_RSTN is asserted with a low logical value, which means a reset cycle starts, and count cou_out is reset to 0.

A data input (labeled "D") of DFF 254 receives an output from AND gate assembly 253. A clock input (labeled "CP") of DFF 254 receives controlled signal CKV. A data output (labeled "Q") of DFF 254 outputs signal cou_out. DFF 254 can be reset by a reset signal RSTN when asserted with a low logical value. Moreover, when controlled signal CKV is asserted, output of AND gate assembly 253 is latched. Further, when both reset signal PULSE_RSTN and controlled signal CKV are asserted, counter 25 is reset and count cou_out is 0.

Figure 4:
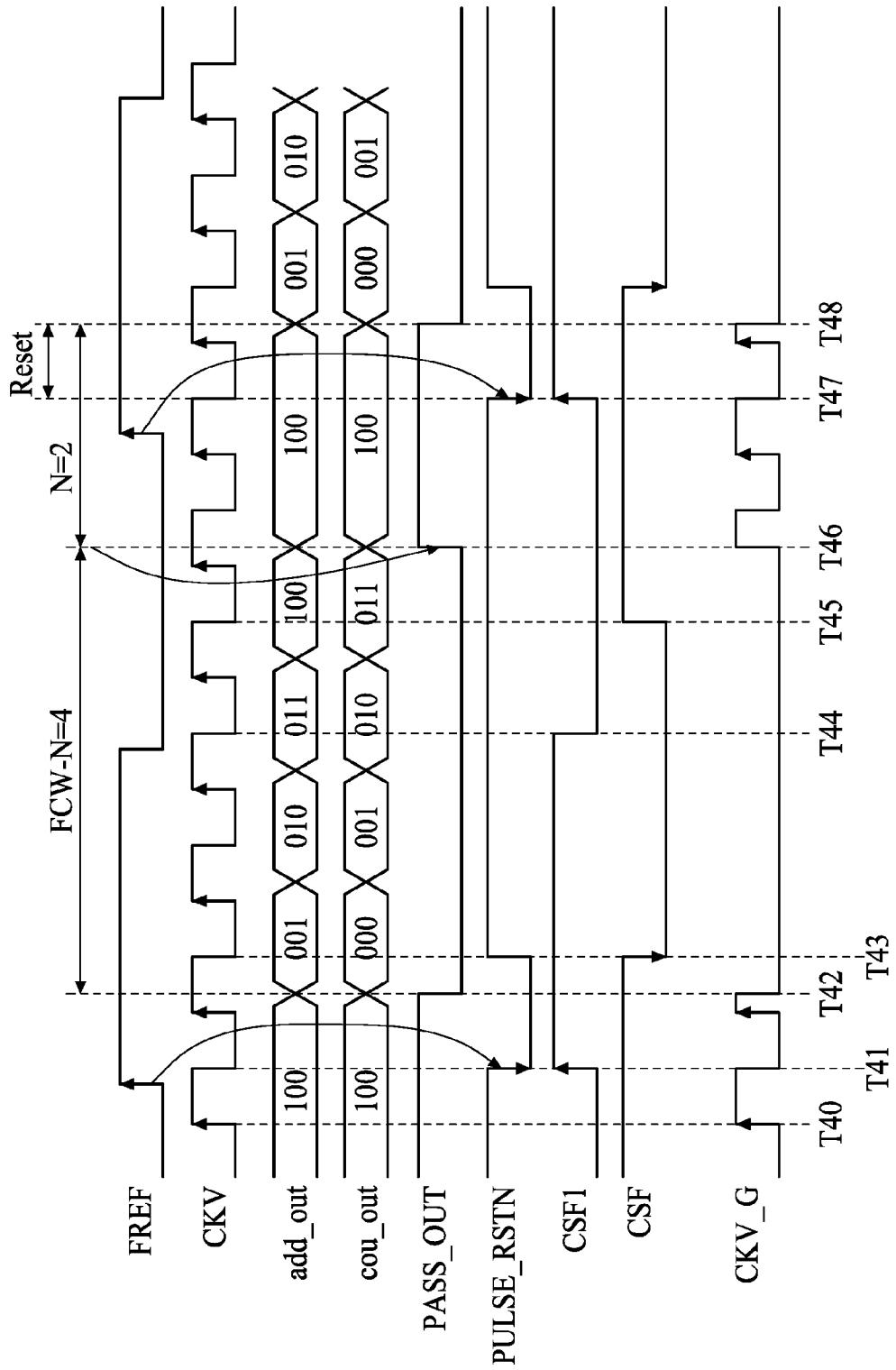
FIG. 4 is a timing diagram of illustrative signals corresponding to the masking circuit in FIG. 3, in accordance with some embodiments.

FIG. 4 is a timing diagram of illustrative signals corresponding to masking circuit 12 in FIG. 3, in accordance with some embodiments. For simplicity, it is assumed that the values of FCW and N are 6 and 2, respectively, and hence the value (FCW−N) is 4. Accordingly, counter 25 is configured to count to 4. Moreover, add_out and cou_out are 3-bit binary signals to account for the decimal value, 4, of (FCW−N).

Referring to FIG. 4, at time T40, for first DFF 211 and second DFF 212, controlled signal CKV is not asserted and no data is latched. Signals CSF1 and CSF are kept at logically low and logically high, respectively. By operation of NAND gate 213, reset signal PULSE_RSTN is kept at logically high.

At time T41, reference signal FREF and controlled signal CKV are asserted. In response to the falling edge of controlled signal CKV, signal CSF1 at the output of first DFF 211 is asserted. However, signal CSF at the output of second DFF 212 is not deasserted until the next falling edge of controlled signal CKV at time T43. At time T41, by operation of NAND gate 213, reset signal PULSE_RSTN is asserted with a low logical value. Accordingly, reset signal PULSE_RSTN is asserted in response to a rising edge of reference signal FREF. The falling edge of reset signal PULSE_RSTN at time T41 initiates a reset cycle. Moreover, reset signal PULSE_RSTN is logically low in a period between time T41 and time T43, the reset cycle.

At time T42, since reset signal PULSE_RSTN is logically low, the output of AND gate assembly 253 is binary 000. This binary data is latched when controlled signal CKV is asserted at a time a bit earlier than time T42, and outputted as signal cou_out at time T42. Meanwhile, in response to the resetting of counter 25, mask signal PASS_OUT is deasserted with a low logical value. Accordingly, the falling edge of mask signal PASS_OUT appears within the reset cycle in response to a falling edge of reset signal PULSE_RSTN, which in turn is in response to a rising edge of reference signal FREF.

At time T44, signal CSF1 at the output of first DFF 211 is deasserted with a low logical value when a falling edge of controlled signal CKV appears a bit later than a falling edge of reference signal FREF appears. However, signal CSF at the output of second DFF 212 is not asserted then until the next falling edge of controlled signal CKV at time T45.

In response to the falling edge of mask signal PASS_OUT at time T42, counter 25 starts to count to (FCW−N) or 4 (binary 100) in the present embodiment. Moreover, multiplexer 251 selects logic 1 as output. As a result, by operation of adder 252, the value of signal add_out is greater than that of signal cou_out by 1.

As counter 25 counts to 4 at time T46, mask signal PASS_OUT is asserted with a high logical value. Accordingly, the rising edge of mask signal PASS_OUT appears in response to the event when counter 25 counts to the value (FCW−N), and thus is determined by the value (FCW−N). In response to the rising edge of mask signal PASS_OUT, multiplexer 251 selects logic 0 as output. As a result, by operation of adder 252, the content of signal add_out is the same as signal cou_out.

At time T46, in response to the rising edge of mask signal PASS_OUT, a portion of pulses of controlled signal CKV, represented by gate signal CKV_G, is allowed to pass to TDC core 11 for detection of phase difference.

At time T47, similar to the event at time T41, reset signal PULSE_RSTN is asserted with a low logical value in response to a rising edge of reference signal FREF, which initiates another reset cycle.

At time T48, in response to the resetting of counter 25, mask signal PASS_OUT is deasserted with a low logical value. CKV pulses are then masked or gated from TDC core 11. The active period of mask signal PASS_OUT, from time T46 to time T48, is determined by the value of N.

Figure 5:
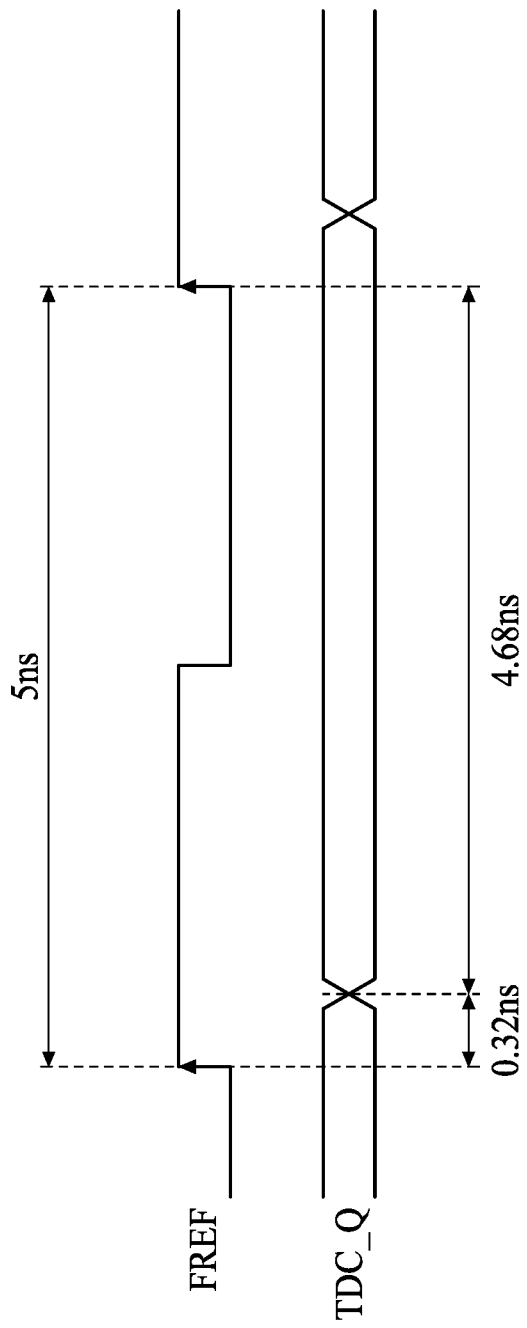
FIG. 5 is an exemplary diagram showing available operation time for a TDC.

FIG. 5 is an exemplary diagram showing available operation time for TDC 10. In some embodiments, reference signal FREF operates at approximately 200 MHz, and thus the period of reference signal FREF is 5 ns. Furthermore, in TDC core 11 propagation delay for transmission signal from flip flops to a detector is approximately 0.32 ns, as shown in FIG. 5. Since phase difference detection is required to be done in one FREF period, the time allowance for digital circuits in TDC 10 to operate is approximately 4.68 ns. Accordingly, the digital circuits can operate at approximately 213 MHz (=1/(4.68 ns)). In some existing TDCs, however, given the delay of 2 ns caused by delay elements, the total delay would add up to 2.32 ns. Consequently, the time allowance is approximately 2.68 ns, which means that digital circuits need to operate at approximately 373 MHz (=1/(2.68 ns)). As compared to those TDCs, TDC 10 according to the present disclosure provides more flexible design space.

Figure 6:
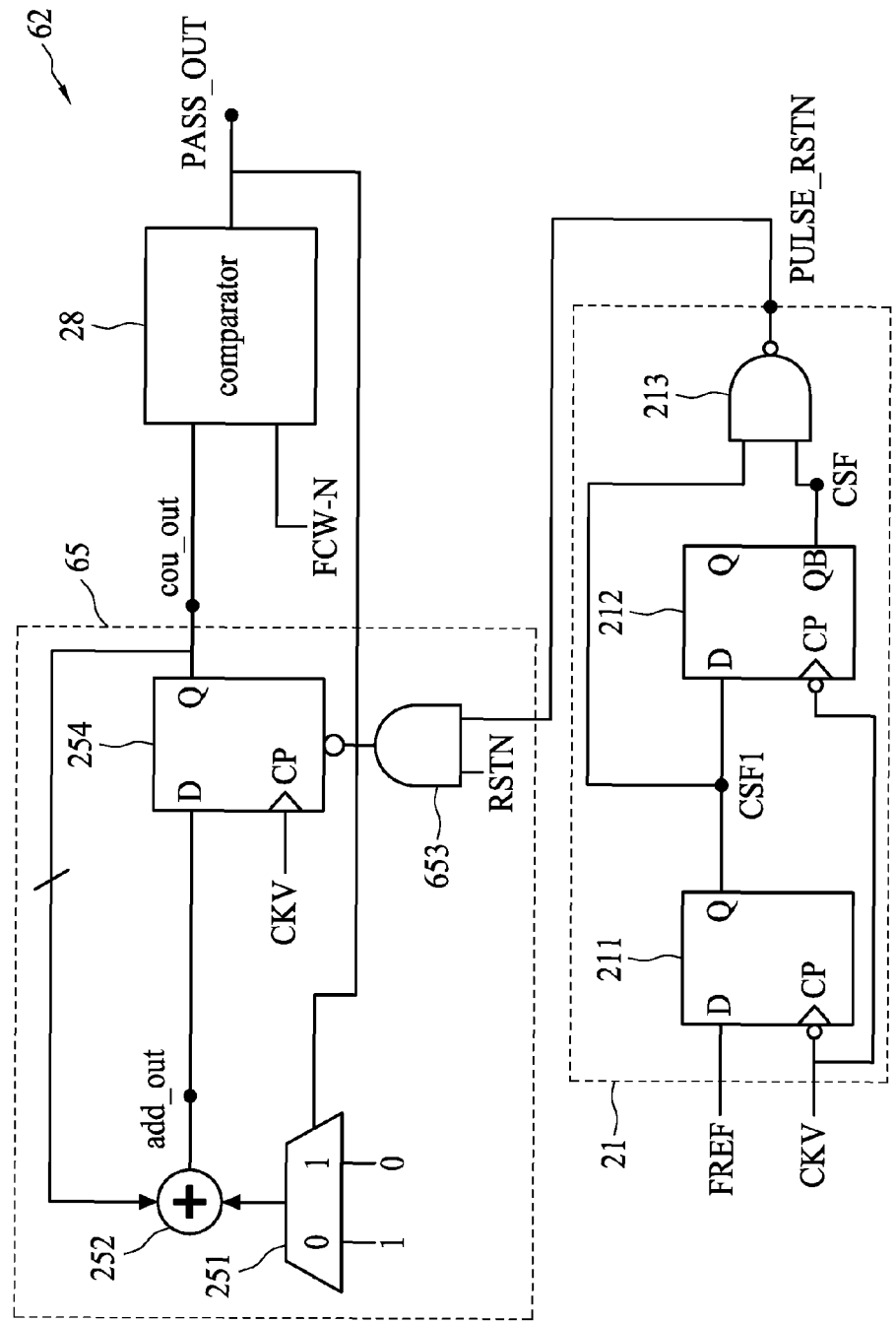
FIG. 6 is a circuit diagram of another masking circuit in accordance with some embodiments.

FIG. 6 is a circuit diagram of another masking circuit 62 in accordance with some embodiments. Referring to FIG. 6, masking circuit 62 is similar to masking circuit 12 described and illustrated with reference to FIG. 3 except that, for example, a logic AND gate 653 replaces AND gate assembly 253. An input of AND gate 653 receives reset signal RSTN, and another input of AND gate 653 receives reset signal PULSE_RSTN. An output of AND gate 653 is coupled to a reset port of DFF 254. Moreover, AND gate assembly 253 in FIG. 3 is positioned between adder 252 and DFF 254, while AND gate 653 is coupled between an output of reset circuit 21 and the reset port of DFF 254. With the removal of AND gate assembly 253 from the feedback path of DFF 254, masking circuit 62 can be expected to run faster than masking circuit 12.

In operation, reset signal RSTN may be normally kept logically high. As a result, resetting of counter 65 depends on the logic state of reset signal PULSE_RSTN from reset circuit 21. When reset signal PULSE_RSTN is asserted with a low logical value, AND gate 653 outputs a low logic value to reset DFF 254 and hence counter 65.

Figure 7:
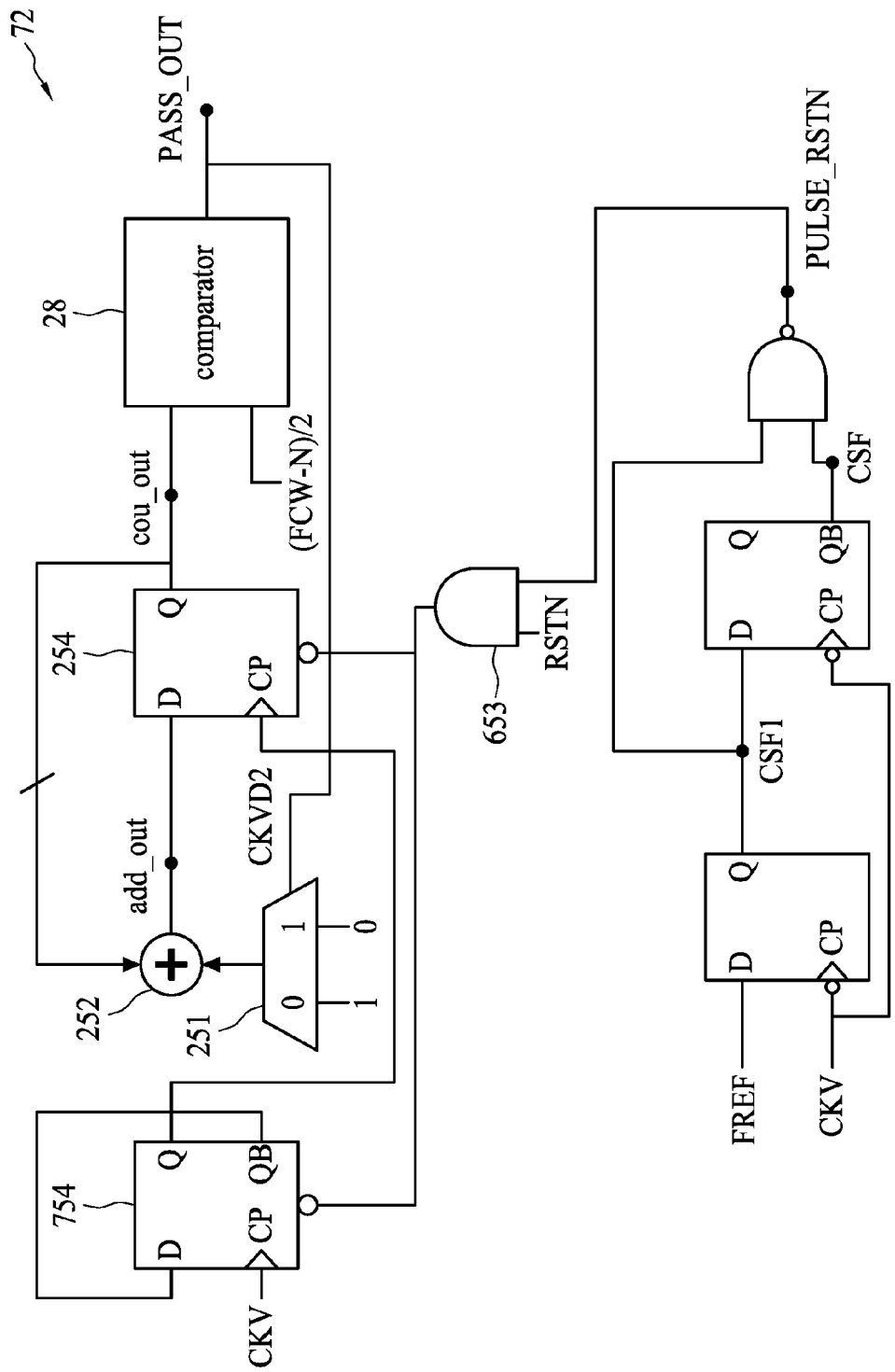
FIG. 7 is a circuit diagram of yet another masking circuit in accordance with some embodiments.

FIG. 7 is a circuit diagram of yet another masking circuit 72 in accordance with some embodiments. Referring to FIG. 7, masking circuit 72 is similar to masking circuit 62 described and illustrated with reference to FIG. 6 except that, for example, a DFF 754 is added. A clock input (labeled "CP") of DFF 754 receives controlled signal CKV. A data input (labeled "D") of DFF 754 is coupled to a complementary data output (labeled "QB") thereof. A reset port of DFF 754 is coupled to an output of AND gate 653. Moreover, a data output (labeled "Q") of DFF 754 is coupled to the clock input of DFF 254. Accordingly, DFF 754 forms a divide-by-two frequency divider. In some embodiments, controlled signal CKV operates at 3 GHz2, and a controlled signal CKVD2 of DFF 254 operates at 1.5 GHz, a half of the CKV frequency. The period of controlled signal CKVD2 is thus twice that of controlled signal CKV, which provides a designer with more flexible design space. clock port logic AND gate 653 replaces AND gate assembly 253. For masking circuit 72, the frequency command word and the number of pulses for phase difference detection, denoted as FCWD2 and ND2, respectively, are discussed below.

$$FCWD2 = \frac{CKVD2(\text{frequency})}{FREF(\text{frequency})} = \frac{0.5CKV(\text{frequency})}{FREF(\text{frequency})} = (1/2)FCW$$

$$PCKVD2 \times ND2 > DTDC$$

where PCKVD2 represents the period of controlled signal CKVD2, and DTDC represents the delay to be introduced by the delay elements in TDC core 11 if controlled signal CKVD2 enters TDC core 11 without masking.

Since PCKVD2 is twice of PCKV, given DTDC being unchanged, ND2 is a half of N. The command signal for comparator 28 of masking circuit 72 is (FCWD2−ND2), which equals (FCW−N)/2. In an exemplary embodiment that the values of FCW and N are 6 and 2, respectively, the values of FCWD2 and ND2 are 3 and 1, respectively. Counter 25 now counts to (FCWD2−ND2), or 2. Accordingly, a 2-bit binary cou_out is enough to represent a count of counter 25.

In some embodiments, a masking circuit may include "M" DFFs, M being a natural number. In these DFFs, a data output of one DFF is coupled to a clock input of a next-stage DFF. As a result, the "M" DFFs form a divide-by-M frequency divider. The values of FCW and N for such a masking circuit can be calculated in a similar fashion as previously discussed. Moreover, a counter in the masking circuit is configured to count to (FCW−N)/M.

Figure 8:
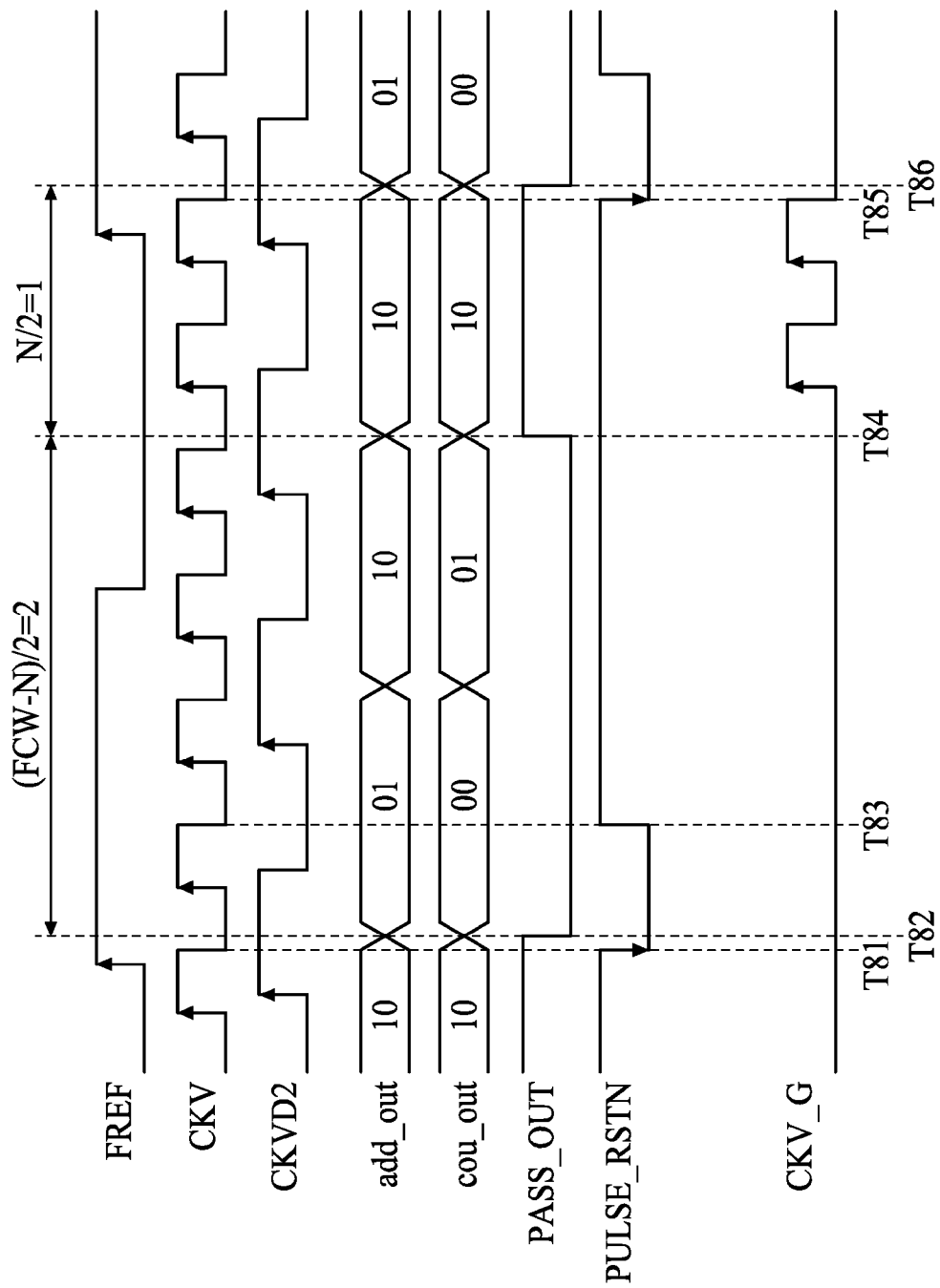
FIG. 8 is a timing diagram of illustrative signals corresponding to the masking circuit in FIG. 7, in accordance with some embodiments.

FIG. 8 is a timing diagram of illustrative signals corresponding to masking circuit 72 in FIG. 7, in accordance with some embodiments. Referring to FIG. 8, at time T81, reset signal PULSE_RSTN is asserted. Reset signal PULSE_RSTN is kept active low during a reset cycle between time T81 and time T83.

At time T82, mask signal PASS_OUT is deasserted in response to the fact that counter 28 is reset to 0 and controlled signal CKVD2 is asserted. Subsequently, counter 25 counts all the way from 0 (00 in binary), 1 (01 in binary) to 2 (10 in binary).

At time T84, mask signal PASS_OUT is asserted in response to the fact that counter 28 counts to 2 and controlled signal CKVD2 is asserted.

At time T85, reset signal PULSE_RSTN is again asserted to reset counter 25.

At time T86, mask signal PASS_OUT is deasserted in response to the fact that counter 28 is reset to 0. The rising edge of mask signal PASS_OUT is determined by (FCW−N)/2 and appears when counter 25 counts to (FCW−N)/2. The falling edge of mask signal PASS_OUT is determined by a rising edge of reference signal FREF and appears when counter 25 is reset. During the active period of mask signal PASS_OUT, a total number of 2 CKV pulses in an FREF period are passed for phase difference detection, and the remaining CKV pulses in the FREF period are masked from TDC core 11.

Figure 9:
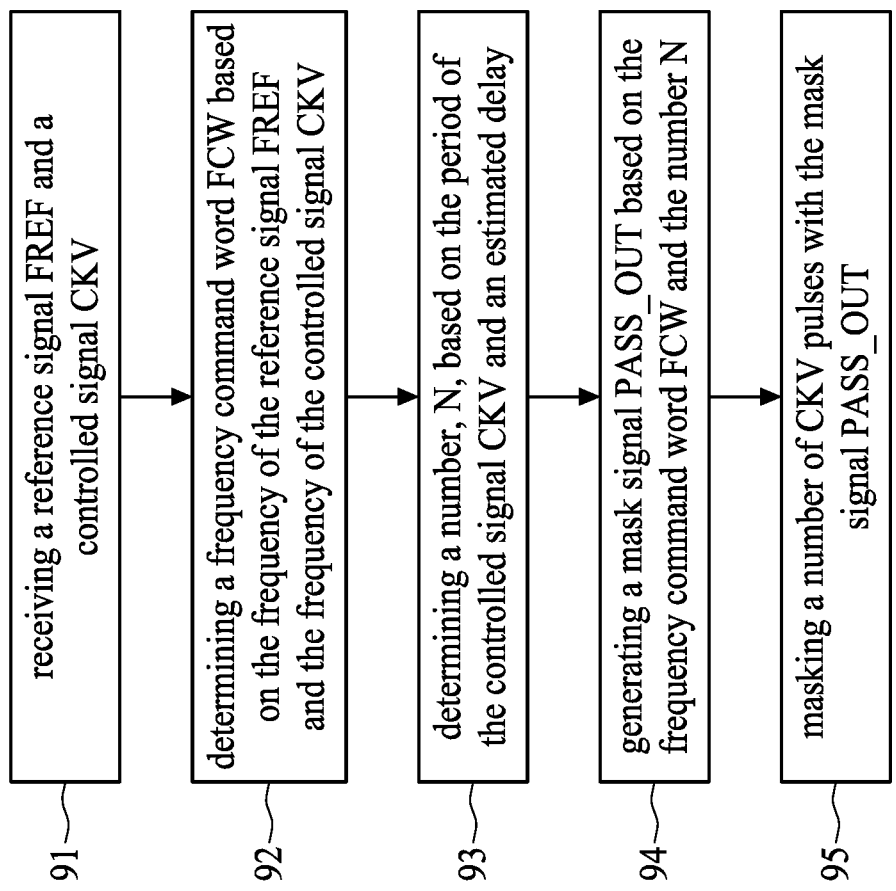
FIG. 9 is a flow diagram illustrating a method of masking clock signals for a TDC, in accordance with some embodiments.

FIG. 9 is a flow diagram illustrating a method of masking a signal from a TDC, in accordance with some embodiments. Referring to FIG. 9, in operation 91, a reference signal FREF and a controlled signal CKV are received. A phase difference exists between reference signal FREF and controlled signal CKV and needs to be detected.

In operation 92, a frequency command word FCW is determined based on the frequency of reference signal FREF and the frequency of controlled signal CKV. In some embodiments, the value of FCW may be rounded off to an integer.

In operation 93, a number, "N," is determined based on the period of controlled signal CKV and an estimated delay. In some embodiments, N is a natural number. The estimated delay is introduced by delay elements in a TDC for detecting a phase difference between reference signal FREF and controlled signal CKV if all CKV pulses are entered.

In operation 94, a mask signal PASS_OUT is generated based on the frequency command word FCW and the value of N. In some embodiments, a rising edge of mask signal PASS_OUT is determined by the value of (FCW−N), while a falling edge of mask signal PASS_OUT is determined by a rising edge of reference signal FREF.

In operation 95, a number of CKV pulses are masked by mask signal PASS_OUT. The number of CKV pulses to enter the TDC is determined by the value of N. Moreover, the active period of mask signal PASS_OUT in one FREF period is determined by the value of N.

Embodiments of the present disclosure provide a masking circuit for a time-to-digital converter (TDC). The masking circuit comprises a reset circuit, a counter and a comparator. The reset circuit is configured to generate a reset signal based on a reference signal and a controlled signal. The reference signal and the controlled signal are to be sent to the TDC for detection of phase difference. The counter is configured to count to a predetermined value associated with the reference signal and the controlled signal, and is configured to be reset to an initial value in response to the reset signal. The comparator is configured to compare a count from the counter and the predetermined value, and to generate a mask signal when a count from the counter equals the predetermined value. The mask signal masks a portion of pulses of the controlled signal from entering the TDC.

Some embodiments of the present disclosure provide a circuit. The circuit comprises a counter and a comparator. The counter is configured to provide a count, and count, based on a reference signal and a controlled signal, to a predetermined value. The reference signal and the controlled signal are configured for adjusting a delay introduced by a delay element of a phase detector in an all digital phase locked loop (ADPLL). The comparator is configured to generate a masking signal for masking a portion of pulses of the controlled signal by comparing the count and the predetermined value.

Embodiments of the present disclosure also provide a method. The method includes receiving a reference signal and a controlled signal configured for adjusting a delay introduced by a delay element of a phase detector in an all digital phase locked loop (ADPLL), providing a count, counting to a predetermined value based on the reference signal and the controlled signal; and generating a masking signal for masking a portion of pulses of the controlled signal by comparing the count and the predetermined value.

The foregoing outlines features of several embodiments so that persons having ordinary skill in the art may better understand the aspects of the present disclosure. Persons having ordinary skill in the art should appreciate that they may readily use the present disclosure as a basis for designing or modifying other devices or circuits for carrying out the same purposes or achieving the same advantages of the embodiments introduced therein. Persons having ordinary skill in the art should also realize that such equivalent constructions do not depart from the spirit and scope of the present disclosure, and that they may make various changes, substitutions and alternations herein without departing from the spirit and scope of the present disclosure.

What is claimed is:

1. A masking circuit for a time-to-digital converter (TDC), the masking circuit comprising:
   a reset circuit configured to generate a reset signal based on a reference signal and a controlled signal, the reference signal and the controlled signal to be sent to the TDC for detection of phase difference;
   a counter configured to count to a predetermined value associated with the reference signal and the controlled signal, and configured to be reset to an initial value in response to the reset signal; and
   a comparator configured to compare a count from the counter and the predetermined value, and to generate a masking signal when a count from the counter equals the predetermined value, the masking signal masking a portion of pulses of the controlled signal from entering the TDC.

2. The masking circuit of claim 1, wherein the predetermined value is (FCW−N), where FCW represents a frequency command word obtained by dividing the frequency of the controlled signal by the frequency of the reference signal, and N is a natural number that satisfies $$PCKV \times N > DTDC,$$

where PCKV represents the period of the controlled signal, and DTDC represents a delay to be introduced in the TDC if the controlled signal enters the TDC without masking.

3. The masking circuit of claim 1, wherein the counter includes a selecting device configured to receive the masking signal as a control signal.

4. The masking circuit of claim 3, wherein the counter includes a latch device configured to generate a count at a data output in response to the reset signal.

5. The masking circuit of claim 4, wherein the counter includes a summing device configured to add an output from the selecting device and a count from the latch device.

6. The masking circuit of claim 5, wherein the counter includes a decision circuit between an output of the summing device and a data input of the latch device.

7. The masking circuit of claim 4, wherein the counter includes a decision circuit between an output of the reset circuit and a reset port of the latch device.

8. The masking circuit of claim 1, wherein the counter includes a first latch device and a second latch device, the first latch device being configured to serve as a frequency divider for the second latch device.

9. The masking circuit of claim 8, wherein the counter includes a decision circuit having an input coupled to an output of the reset circuit, and an output coupled to a reset port in each of the first latch device and the second latch device.

10. The masking circuit of claim 1, wherein the masking signal having an active period determined by the predetermined value.

11. A circuit, comprising:
    a counter configured to provide a count, and count, based on a reference signal and a controlled signal, to a predetermined value, the reference signal and the controlled signal configured for adjusting a delay introduced by a delay element of a phase detector in an all digital phase locked loop (ADPLL); and
    a comparator configured to generate a masking signal for masking a portion of pulses of the controlled signal by comparing the count and the predetermined value.

12. The circuit of claim 11, wherein the comparator generates the the masking signal when the count equals the predetermined value.

13. The circuit of claim 11, wherein the predetermined value is (FCW−N), where FCW represents a frequency command word obtained by dividing the frequency of the controlled signal by the frequency of the reference signal, and N is a natural number that satisfies $$PCKV \times N > DTDC,$$

where PCKV represents the period of the controlled signal, and DTDC represents the delay introduced by the delay element if the controlled signal enters the phase detector without masking.

14. The circuit of claim 11, wherein the counter includes a selecting device configured to receive the masking signal as a control signal.

15. The circuit of claim 14, further comprising:
    a reset circuit configured to generate a reset signal based on the reference signal and the controlled signal.

16. The circuit of claim 15, wherein the counter includes a latch device configured to generate the count at a data output in response to the reset signal.

17. The circuit of claim 16, wherein the counter includes a summing device configured to add an output from the selecting device and a count from the latch device.

18. The circuit of claim 17, wherein the counter includes a decision circuit between an output of the summing device and a data input of the latch device.

19. The circuit of claim 16, wherein the counter includes a decision circuit between an output of the reset circuit and a reset port of the latch device.

20. A method, comprising:
    receiving a reference signal and a controlled signal configured for adjusting a delay introduced by a delay element of a phase detector in an all digital phase locked loop (ADPLL);
    providing a count;
    counting to a predetermined value based on the reference signal and the controlled signal; and
    generating a masking signal for masking a portion of pulses of the controlled signal by comparing the count and the predetermined value.

* * * * *